(12) United States Patent
Ko et al.

(10) Patent No.: US 6,211,557 B1
(45) Date of Patent: *Apr. 3, 2001

(54) CONTACT STRUCTURE USING TAPER CONTACT ETCHING AND POLYCIDE STEP

(75) Inventors: Jun-Cheng Ko, Taichung; Erik S. Jeng, Taipei, both of (TW)

(73) Assignee: Vanguard International Semiconductor Corporation, Hsin-Chu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/277,562

(22) Filed: Mar. 26, 1999

Related U.S. Application Data

(62) Division of application No. 08/845,872, filed on Apr. 28, 1997, now Pat. No. 5,915,198.

(51) Int. Cl.⁷ .............................. H01L 29/76; H01L 23/48
(52) U.S. Cl. ........................ 257/413; 257/755; 257/774; 257/900
(58) Field of Search .................. 257/383, 384, 257/412, 413, 754, 755, 756, 763, 764, 774, 900; 438/592, 595, 637, 640

(56) References Cited

U.S. PATENT DOCUMENTS

| | | | |
|---|---|---|---|
| 5,097,300 | * 3/1992 | Takeuchi | 257/412 |
| 5,206,187 | * 4/1993 | Doan et al. | 438/618 |
| 5,490,901 | 2/1996 | Kim | 156/643.1 |
| 5,491,100 | * 2/1996 | Lee et al. | 438/640 |
| 5,698,072 | * 12/1997 | Fukuda | 156/653.1 |
| 5,750,441 | * 5/1998 | Figura et al. | 438/751 |
| 5,795,820 | * 8/1998 | Kepler | 438/624 |
| 5,795,827 | * 8/1998 | Liaw et al. | 438/663 |

OTHER PUBLICATIONS

S. Wolf, "Silicon Processing for the VLSI Era" vol. 2, Lattice Press, Sunset Beach, CA, 1990, p105, 539.

* cited by examiner

Primary Examiner—T. N. Quach
(74) Attorney, Agent, or Firm—George O. Saile; Stephen B. Ackerman; Sevgin Oktay

(57) ABSTRACT

A method and structure are disclosed related to tapered contact holes in VLSI and ULSI technologies. The contact hole is formed by taking advantage of two-tiered polycide lines formed with a step. The polycide lines with steps are further formed with oxide spacers. The resulting structure is then used to form contact hole in between the oxide spacers. Because the oxide spacers are used—without the need for a tightly toleranced mask—to delimit the area of the contact at the bottom of the hole, a larger area of contact is obtained in addition to the tapered edges that are formed. Polycide is chosen to be a multilayer structure comprising tungsten-silicide ($WSi_2$) over poly-silicon (poly-Si). Next, polycide is patterned by etching with a recipe which etches the $WSi_2$ faster than it etches the underlying poly-Si. The etching, therefore, results in a structure where the $WSi_2$ forms a step over the poly-Si layer. A layer of TEOS oxide is then deposited over the step structure and etched, thus forming oxide spacers surrounding the step structure. A second layer of TEOS is deposited and etched forming contact holes with the desired, gentle slopes yielding at the same time wide contact area at the bottom of the hole with improved reliability.

6 Claims, 5 Drawing Sheets

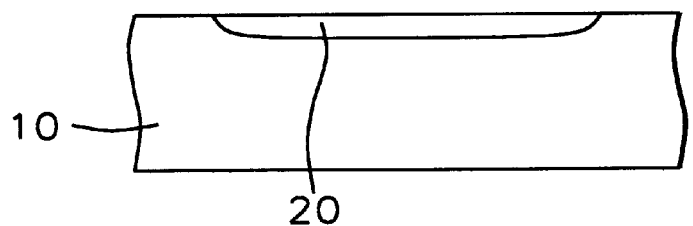
*FIG. 1a – Prior Art*
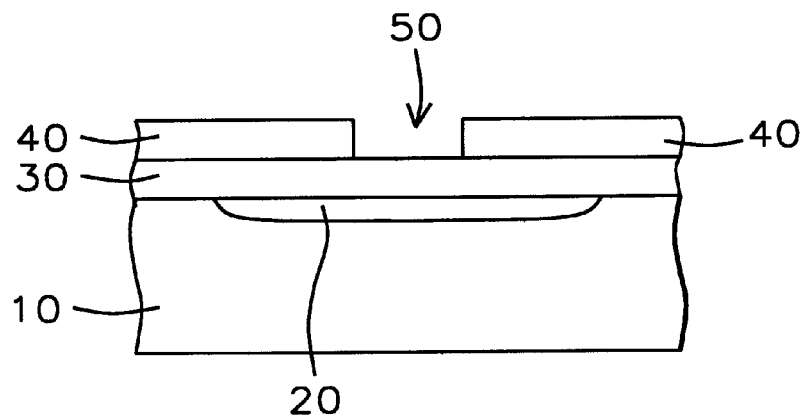
*FIG. 1b – Prior Art*
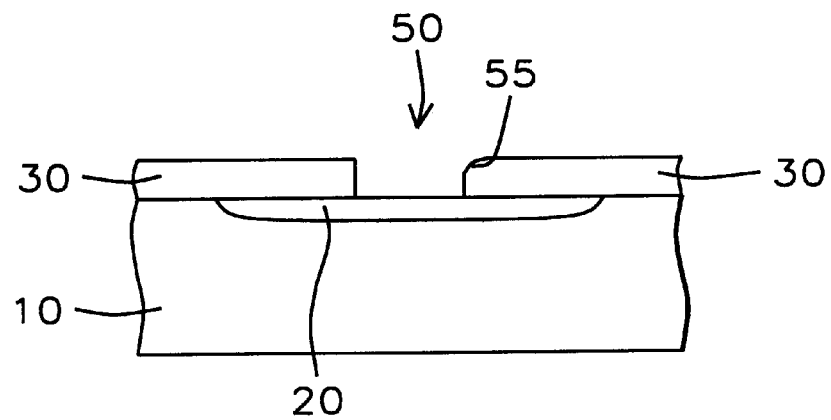
*FIG. 1c – Prior Art*

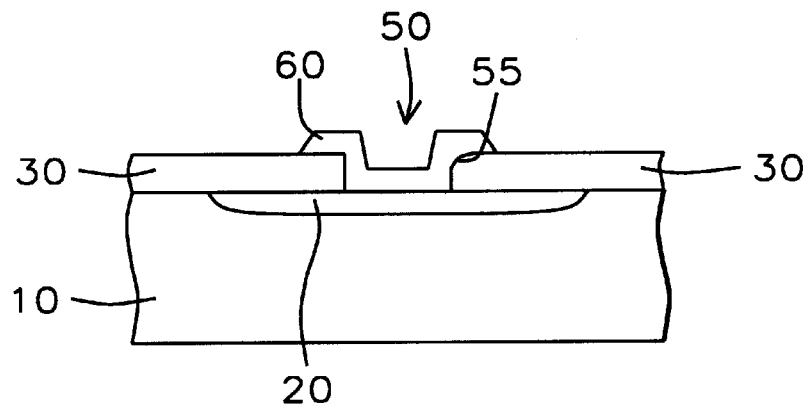
FIG. 1d – Prior Art
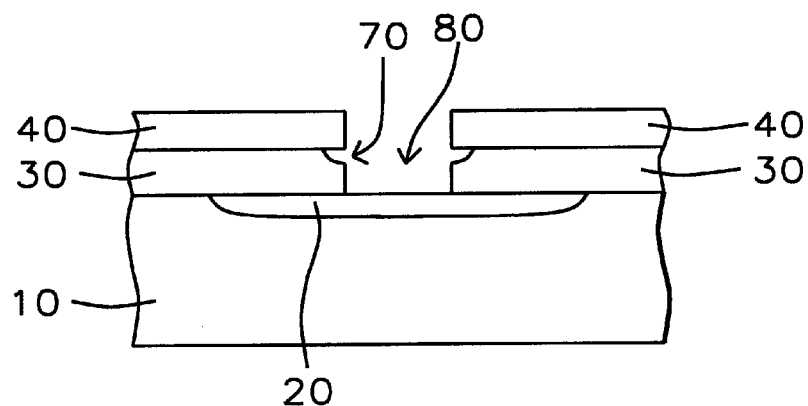
FIG. 2 – Prior Art
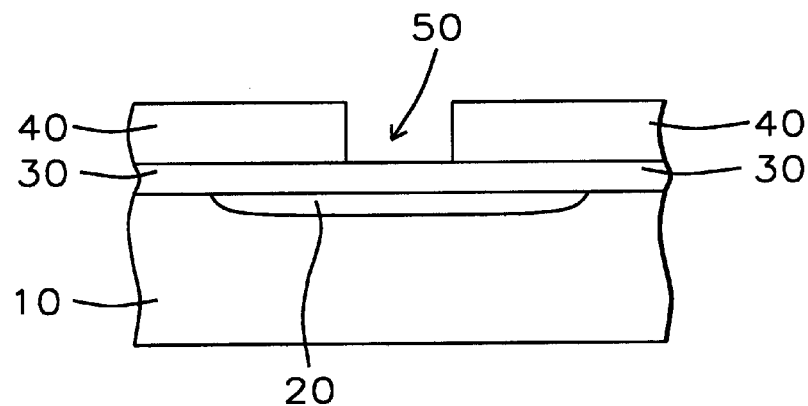
FIG. 3a – Prior Art

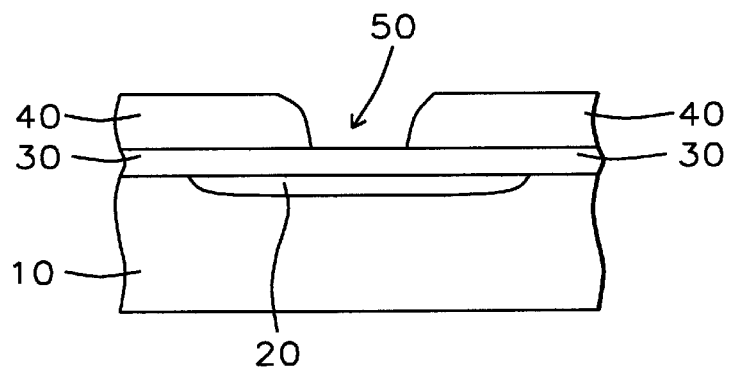
*FIG. 3b – Prior Art*
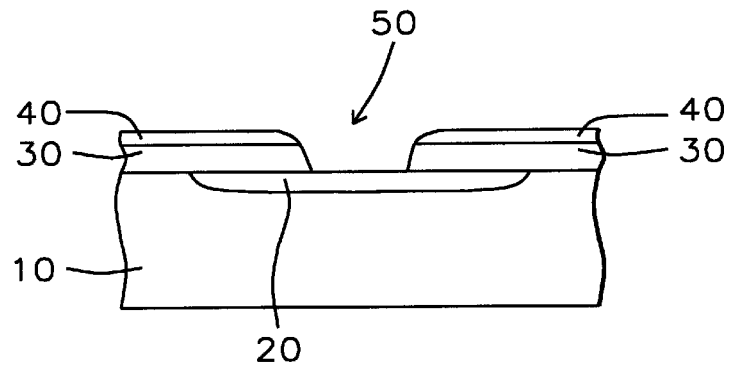
*FIG. 3c – Prior Art*
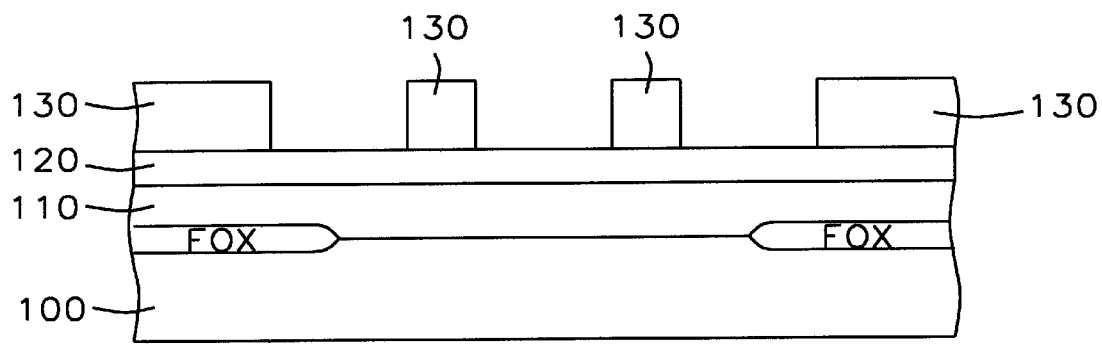
*FIG. 4a*

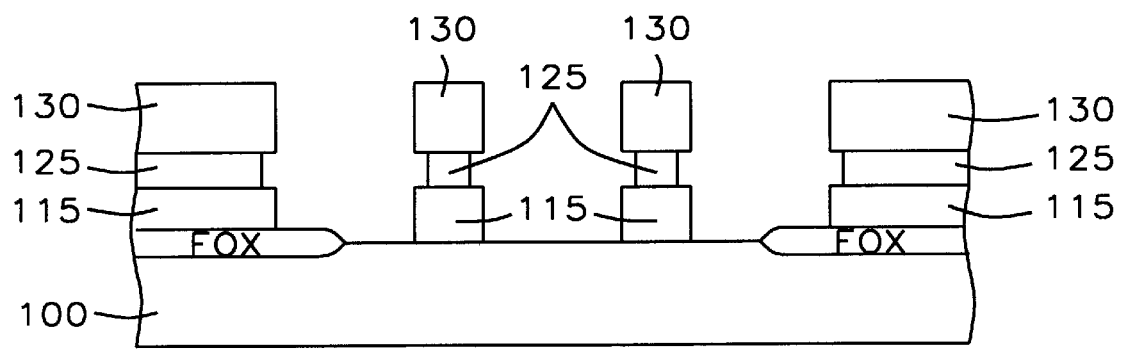
*FIG. 4b*
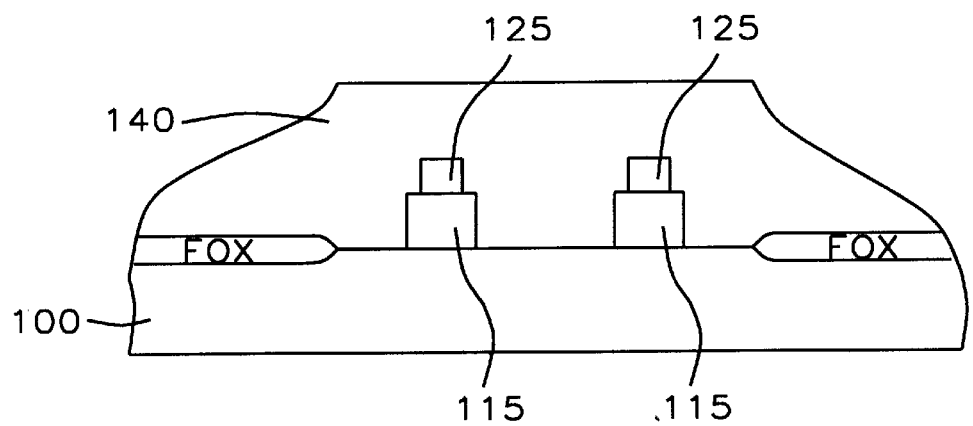
*FIG. 4c(1)*
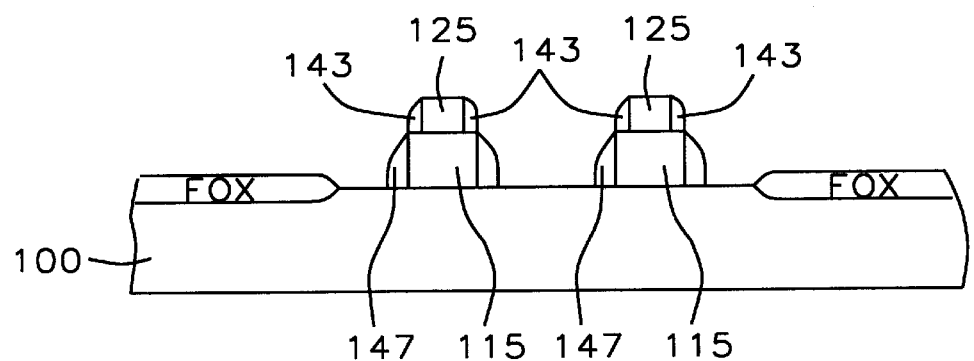
*FIG. 4c(2)*

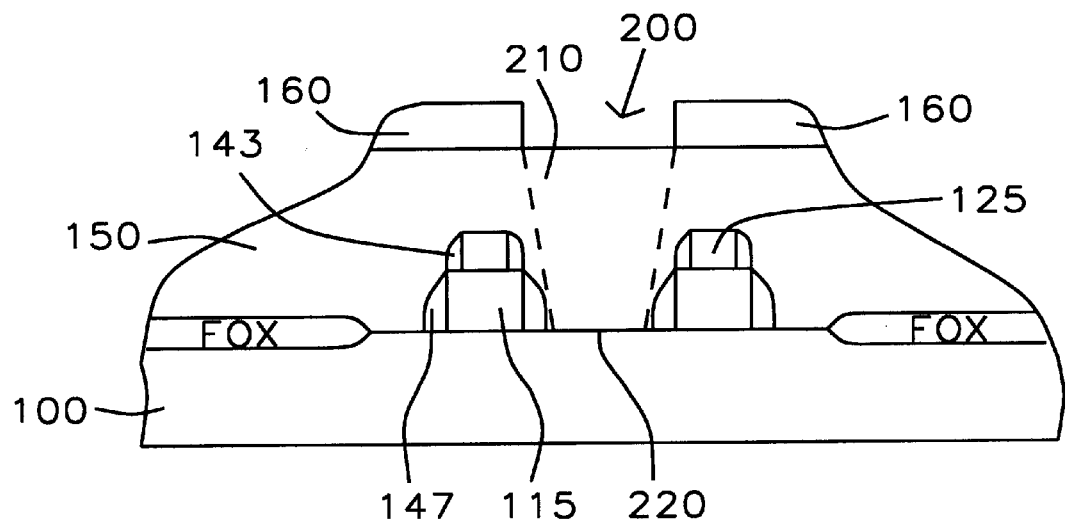
FIG. 4d(1)
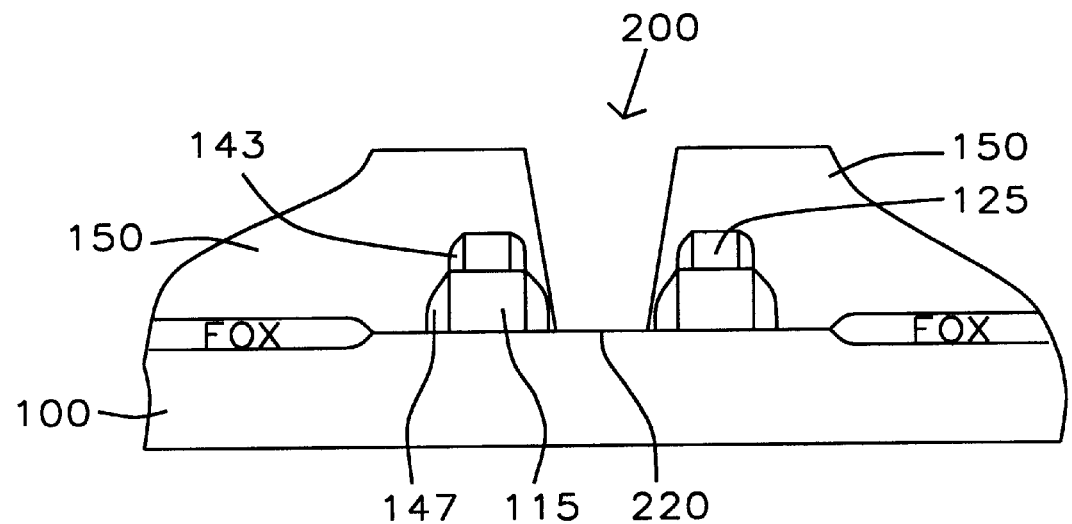
FIG. 4d(2)

CONTACT STRUCTURE USING TAPER CONTACT ETCHING AND POLYCIDE STEP

This is a division of patent application Ser. No. 08/845,872, filing date Apr. 28, 1997, U.S. Pat. No. 5,915,198, New Contact Process Using Taper Contact Etching And Polycide Step, assigned to the same assignee as the present invention.

BACKGROUND OF THE INVENTION

(1) Field of the Invention

The present invention relates to manufacturing of semiconductor devices in general, and in particular, to a new method for forming tapered contact openings by using a polycide step.

(2) Description of the Related Art

Making reliable contact with myriad of devices that are formed into a semiconductor substrate is one of the more difficult aspects of semiconductor manufacturing. The submicron devices are fabricated and isolated within a single-crystal substrate, and are further insulated by growing an oxide layer on the top surface of the substrate. The devices are then connected to form integrated circuits. The connections are accomplished by forming holes through the insulating layer and depositing high conductivity thin-film metal structures which in turn contact the underlying devices. As is well appreciated in the art, the geometry and size of the holes govern how well and reliably the contacts can be made. For example, if the walls of the hole are straight and vertical, then the metal that is deposited into the hole may not cover the edge of the hole properly. That is, the metal at the edge of the hole may be sharp and thin, giving rise to higher electrical resistance, or, for that matter, to breakage later on. In prior art, this is sometimes referred to as the "step coverage" problem and numerous methods have been devised to overcome it. Contouring the sidewalls or tapering the edge of the hole are some of the techniques that are used and are described below briefly. However, it will be seen that the conventional techniques are complex and complicated.

Following the well known art of forming a metal-semiconductor contact structure for an integrated circuit, FIG. 1a shows a silicon substrate (10) with heavily doped region (20) extending into the silicon. The doped region represents areas of the substrate wafer, for example, where the source/drain of a MOS device would be formed and electrical contacts made. A "window" or contact hole is etched into an oxide layer (30) through a hole pattern in a photoresist mask (40) that covers the silicon wafer surface as shown in FIG. 1b. Contact hole (50) is shown in FIG. 1c after the mask has been removed. The oxide is typically a thermal oxide or chemical vapor deposited (CVD) oxide, while etching is an oxide removal process that can be accomplished by using either wet or dry etching as will be discussed further later. Prior to deposition of metal (60), the surface of the silicon wafer is cleaned to remove the thin native-oxide layer that rapidly forms on a silicon surface whenever it is exposed to oxygen, such as in air. Metal film (60) is deposited onto the wafer surface and makes contact with the silicon wherever contact holes have been formed in the oxide. In the simplest contact structure, the deposited metal is aluminum (Al) or an Al:Si alloy. For completeness, we note that after deposition, the contact structure is subjected to a thermal cycle known as sintering of annealing. The purpose of this step is to bring the metal and silicon surfaces into intimate contact. The nature and the area of the contact become important for small contact holes required with especially, submicron technologies.

Various methods are used for formation of contact hole windows. For relatively large openings greater than about 2.0 micrometers ($\mu$m), wet etching is often used. Its widespread use stems from the fact that the liquid etchant systems can be formulated to have very high selectivity to both the substrate and masking layers. That is, during the etching of contact holes in the oxide, neither the mask—which is usually a photoresist—nor the substrate materials are very much affected. The isotropic nature of wet etching, however, makes it difficult when etching smaller sized and closely patterned contact holes, especially for the sub-micron VLSI and ULSI (ultra large scale integrated) technologies. This is because, when etching progresses at the same rate in all directions, that is, isotropically, undercutting occurs if the thickness of the film layer that is being etched is comparable to the minimum pattern dimensions. Of course, undercutting between small and closely spaced holes would be intolerable. Hence, since many films used in VLSI fabrication are 0.5–1.0 $\mu$m thick, reproducible and controllable transfer of patterns in the 1–2 $\mu$m range becomes difficult if not impossible with wet etching, according to S. Wolf in his book "Silicon Processing for the VLSI Era," vol. 2, Lattice Press, Sunset Beach, Calif., 1990, p. 539. As is well known, an alternative to "wet" etching is the "dry" etching which offers the capability of anisotropic removal of material. Dry etching essentially consists of "ion assisted etching processes" of which reactive ion etching (RIE) providing anisotropic etching, and plasma etching providing isotropic etching are well known.

Though anisotropic etching is useful because it avoids undercutting, that is not always desirable for the reasons indicated in FIG. 1. When the sidewalls of hole (50) are formed vertically as shown in FIG. 1 by dry etching, the step edge (55) of the hole is not usually well covered when the hole is later filled with metal (60). Poor step coverage can lead to electrical discontinuities. This problem can sometimes be alleviated by first using wet or dry isotropic etching in region (70) and then following it with anisotropic etching in region (80) as shown in FIG. 2. The resulting hole geometry is contoured as shown in the same Figure rather than being straight and vertical.

Another approach for sidewall contouring involves the manipulation of the photoresist mask. This is accomplished by controlling the erosion of photoresist that has been baked to produce a sloped photoresist wall. The contact hole pattern on the photoresist are exposed and developed using standard lithographic techniques as explained in Wolf, p. 105 and shown in FIG. 3a. Following develop step, the patterned resist images (40) are subjected to a postdevelop bake. The resist flows during the bake, relaxing the vertical resist profile (FIG. 3b). Etching the resist (40) and oxide (30) at approximately the same rate replicates the tapered-resist profile into the contact hole (50) sidewall as shown in FIG. 3c. It will be known to those skilled in the art that anisotropic etching recipes can be modified to etch in different rates laterally and in vertical direction.

It is clear from cited prior art that almost all different parts that go into making a contact hole, such as the photoresist, the oxide and the elements of etching—isotropic, anisotropic—have been manipulated in one way or another to achieve a desired contact hole. However, the processes are complicated and complex. Still another method proposed in U.S. Pat. No. 5,490,901 involves the use of several masks for forming a contact hole in a semiconductor device exhibiting elevated topology. This adds further to the complexity by introducing additional masks. In the present invention, a simple and relatively easy method is disclosed where the number of process steps are reduced and the reliability of the contact hole so formed is improved.

SUMMARY OF THE INVENTION

It is therefore an object of this invention to provide a new method for forming tapered contact holes in semiconductor devices.

It is another object of this invention to reduce the number of steps in forming contact holes in semiconductor devices.

It is still another object of this invention to provide a method for improving the reliability of contact holes through widened isolation windows.

These objects are accomplished by providing a silicon substrate having active and field regions defined, gate oxide formed and depositing a multilayer polycide over the surface of the substrate. Polycide is chosen to be a multilayer structure comprising a tungsten-silicide ($WSi_2$) over polysilicon (poly-Si). Next, polycide is patterned by etching with a recipe which etches the $WSi_2$ faster than it etches the underlying poly-Si. The etching, therefore, results in a structure where the $WSi_2$ forms a step over the poly-Si layer. A layer of TEOS oxide is then deposited over the step structure and etched, thus forming oxide spacers surrounding the step structure. A second layer of TEOS is deposited and etched forming contact holes with the desired, gentle slopes yielding at the same time wide contact area at the bottom of the hole with improved reliability.

BRIEF DESCRIPTION OF THE DRAWINGS

In the accompanying drawings, similar numerals refer to similar parts throughout the several views.

FIGS. 1a–1d show steps of forming a conventional metal-semiconductor contact structure.

FIG. 2 shows a prior art contouring of the edge of a contact hole by performing isotropic and anisotropic etching of the sidewalls.

FIGS. 3a–3c show the conventional tapering of a contact hole by reflowing the resist profile with a resist bake, followed by a dry etch to transfer the resist profile into the oxide.

FIG. 4a shows a cross section of a substrate having a MOS structure and spun with a photoresist mask with images that are to be patterned into a multilayered polycide structure according to this invention.

FIG. 4b shows the step formed into the top silicide layer of the two-tiered multilayered polycide after the substrate of FIG. 4a has been etched according to this invention.

FIGS. 4c(1) and 4c(2) show the oxide spacers that have been formed onto the two-tiered polycide of this invention.

FIGS. 4d(1) and 4d(2) show the formation of contact hole by etching the oxide in the space between the oxide spacers.

DESCRIPTION OF THE PREFERRED EMBODIMENTS

Referring now to the drawings, in particular to FIGS. 4a–4d, there are shown schematically, steps for forming a window or a contact hole in a semiconductor substrate (100). In FIG. 4a, substrate (100) is provided with a multilayer polycide structure consisting of a layer of a metal silicide ($MSi_x$) (120) over a layer of polysilicon (poly-Si) (110). In a MOS structure such as depicted in FIGS. 4a–4d, it is preferred that the polycide is deposited after the gate oxide step (not shown). Also, of the metal silicides that are known in the field, tungsten-silicide ($WSi_2$) is preferred to form the polycide multilayer structure. It will be apparent to those skilled in the art that refractory metal silicides are commonly used to decrease the electrical resistance and capacitance associated with interconnection paths in VLSI circuits, especially in submicron technologies. Additionally, however, the present invention discloses a method for using the $WSi_2$ structure in forming tapered windows for improved contact holes as will be described with the remaining Figures.

Polysilicon layer (110) shown in FIG. 4a is deposited by chemical-vapor deposition (CVD) over the whole wafer substrate (100). Tungsten-silicide is preferably formed using $WF_6$ at a flow rate between about 1 to 10 standard cubic centimeters per minute (sccm) with $SiO_2H_2$ at a rate between about 50 to 200 sccm and at a temperature between about 400 to 600° C. It will be understood by those skilled in the art that other techniques of deposition can also be employed without departing from the spirit of this invention. Thus, deposition of the pure refractory or other metal on the polysilicon, or simultaneous evaporation (co-evaporation) of the silicon and the refractory metal from two sources, or sputter-depositing the silicide, either from a composite target, or by co-sputtering or layering can all be used. It is preferred that the thicknesses of the poly-Si and $WSi_2$ are between about 0.1 to 0.2 micrometers ($\mu$m) and 0.1 to 0.2 $\mu$m, respectively.

The patterning of polycide multilayer structure is usually accomplished by first patterning the underlying poly-Si by etching, and then depositing pure metal on top, and forming the silicide by direct metallurgical reaction. The metal that is deposited on poly-Si reacts to form silicide, and metal that is deposited in other areas remains unreacted, which can be subsequently removed by selective etch. However, a main feature and key spirit of the present invention is that the silicide $WSi_2$ is formed on an unpatterned poly-Si as shown in FIG. 4a. Using a photoresist mask (130) shown in the same Figure, the multilayered polycide structure is patterned as shown in FIG. 4b. The photoresist is of material Novolak positive manufactured by Sumitomo Co., and is spun to a thickness between about 0.7 to 1.5 $\mu$m. It is another feature and of the same spirit of the present invention that the resulting structure have the step form (115, 125) shown in FIG. 4b. It will be shown next that the stepped polycide lines (115, 125) of FIG. 4b makes possible to form a wide window (210) with a gentle slope and large contact area (220) for improved and reliable contact with the substrate of (FIG. 4d).

In order to fabricate the step structure shown in FIG. 4b, polycide is etched using a recipe that is anisotropic with respect to tungsten-Si layer (120) but isotropic with respect to poly-Si layer (110) while having high selectivity against the photoresist mask and the substrate. In other words, the etching recipe etches $WSi_2$ isotropically rather than the poly-Si, and preferably comprises HBr flowing at a rate between about 80 to 200 sccm with $O_2$ also at a rate between about 80 to 200 sccm at a pressure between about 4 to 12 millitorr. It is preferred that the step width (w) in FIG. 4c is between about 0.25 to 0.45 $\mu$m. It will be noted that the silicide step is centrally located over the polysilicon poly-Si layer.

After the formation of step polycide (125, 115), photoresist mask layer (130) is removed. Subsequently, a layer of LPCVD undoped tetraethyl orthosilicate (TEOS) oxide of thickness between about 0.1 to 0.8 $\mu$m is deposited conformably over the step structure. The TEOS layer (140) shown in FIG. 4c is then anisotropically etched back with a recipe comprising $CF_8$, $CHF_3$ and Ar at a flow rate, respectively, between about 20 to 50 sccm, 20 to 50 sccm, 500 to 1000 sccm and at a pressure between about 500 to 1000 mtorr, RF power between about 600 to 1200 watts until the polycide is exposed. (The top line of FIG. 4c(1) is to indicate the fact that layer (140) is etched back). The unetched portions of TEOS at the vertical sides of the $WSi_2$ step (125) and poly-Si line (115) remain following this etch, thus forming spacers (143) and (147)—namely, a first oxide spacer and a second oxide spacer, respectively—surrounding the respective structures. Thus, a multi-level structure is formed as shown in FIG. 4c(2), where silicide step (125) over polysilicon line (115) along with their respective oxide spacers (143) and (147) will, at a later step, aid in the forming of a contact hole with smooth tapered walls and a large bottom contact area. Following the formation of spacers (143) and (147), a second layer (150) comprising TEOS oxide of thickness between about 1000 to 2000 Å and Borophosphosilicate Glass (BPSG) of thickness between about 4000 to 9000 Å is deposited to form a total thickness between about 0.5 to 1.1 μm as shown in FIG. 4d(1).

A photoresist mask (160) is next formed and exposed to radiation and hardened or fixed so that the unexposed portions thereof will adhere to layer (150) while the exposed portions will be washed away to form aperture (200). It should be noted that aperture (200) is larger than necessary and does not have to be accurately aligned with the contact area (220) shown in FIG. 4d(2). This is because when BPSG/TEOS layer (150) is etched next, the undoped oxide spacers (143) and (147) retard the etch rate relative to the doped oxide surrounding the spacers, and hence, window (210) is formed correctly over contact area (220) on the silicon substrate. At the same time, since the etch recipe is preferably $CHF_3$ based, this recipe provides excess side-wall passivation resulting in a tapered side-wall. The recipe comprises $CHF_3$ and CO flowing at a rate between about 60 to 100 sccm and 150 to 250 sccm, respectively subjected to a pressure between about 20 to 80 mtorr at a RF power between about 800 to 1200 watts.

It will be appreciated by those skilled in the art that the absence of additional masking in forming final contact hole with the substrate is an added advantage of this invention. In addition to reduced process step, because no further mask is used in opening contact area (220), the resulting contact area is in fact larger than that would be obtained with a mask having an overlay mask bias over the contact area. The added contact area becomes especially important as the contact dimensions continue shrinking with the advent of ULSI technology.

In the embodiments above, numerous details were set forth, such as specific preferred materials, process parameter, etc., in order to provide an understanding of the present invention. It will be obvious, however, to those skilled in the art that these specific details need not be employed to practice the present invention. Thus, though one contact window (210) between two polycide lines (115, 125) are depicted in FIG. 4d, the invention is applicable to forming of windows in any portion of an integrated circuit on a substrate. Also, the polycide structure can be of a plurality of layers, and two or plurality of lines, without being confined to two layers or lines.

While the invention has been particularly shown and described with reference to the preferred embodiments thereof, it will be understood by those skilled in the art that various changes in form and details may be made without departing from the spirit and scope of the invention.

What is claimed is:

1. A contact hole structure comprising:
   a substrate having gate oxide formed thereon;
   a plurality of polysilicon lines formed on said gate oxide;
   first oxide spacers formed on the vertical sides of said polysilicon lines;
   silicide steps formed centrally over said plurality of polysilicon lines;
   second oxide spacers formed on the vertical sides of said silicide steps;
   wherein said polysilicon lines with their respectively overlying said silicide steps form multi-level structures having their own respective said first and second oxide spacers; and
   a contact hole formed in an insulating material deposited over said substrate including therebetween said multi-level structures having their said first oxide spacers and said second oxide spacers, thus said contact hole having smooth tapered walls within said insulating material adjacent said first and second oxide spacers.

2. The structure of claim 1, wherein said substrate is silicon.

3. The structure of claim 1, wherein the width of said silicide step is between about 0.25 to 0.45 μm.

4. The structure of claim 1, wherein said oxide spacers are TEOS.

5. The structure of claim 1, wherein said contact hole is tapered.

6. The structure of claim 1, wherein the silicide is $WSi_2$.

* * * * *